(12) United States Patent
Acharya et al.

(10) Patent No.: US 8,477,057 B2
(45) Date of Patent: Jul. 2, 2013

(54) SYSTEMS, METHODS, AND APPARATUS FOR SENSING AC VOLTAGE

(75) Inventors: Parag Vishwanath Acharya, Hyderabad (IN); Fred H. Boettner, Salem, VA (US)

(73) Assignee: General Electric Company, Schenectady, NY (US)

( * ) Notice: Subject to any disclaimer, the term of this patent is extended or adjusted under 35 U.S.C. 154(b) by 77 days.

(21) Appl. No.: 13/190,016

(22) Filed: Jul. 25, 2011

(65) Prior Publication Data

US 2013/0027238 A1   Jan. 31, 2013

(51) Int. Cl.
*H03M 1/12*   (2006.01)
(52) U.S. Cl.
USPC .......................................... 341/155; 324/127
(58) Field of Classification Search
USPC ............... 341/155; 324/127, 204, 228, 551, 324/100, 117, 252, 105, 654, 663
See application file for complete search history.

(56) References Cited

U.S. PATENT DOCUMENTS 6,650,557 B2 * 11/2003 Ferens et al. .................. 363/126

FOREIGN PATENT DOCUMENTS

| EP | 01820034 B1 | 8/2007 |
| WO | 2006053567 A2 | 5/2006 |

* cited by examiner

*Primary Examiner* — Joseph Lauture
(74) *Attorney, Agent, or Firm* — Sutherland Asbill & Brennan LLP

(57) ABSTRACT

Certain embodiments of the invention may include systems, methods, and apparatus for sensing AC voltage. According to an example embodiment of the invention, a method is provided for sensing AC voltage. The method includes providing a voltage sensing circuit in communication with an AC power source; rectifying an AC signal from the AC power source with rectifier circuitry of the voltage sensing circuit; applying a first voltage to an analog-to-digital (A-to-D) converter circuit, wherein the first voltage is across a second resistive element of a first half cycle voltage divider comprising a first resistive element and the second resistive element and in communication with a positive DC output of the rectifier circuitry; and analyzing the first digital voltage value and the second digital voltage value by a processor to determine a voltage of the AC power source.

20 Claims, 3 Drawing Sheets

SYSTEMS, METHODS, AND APPARATUS FOR SENSING AC VOLTAGE

FIELD OF THE INVENTION

This invention generally relates to sensing AC voltage and in particular to sensing AC voltage of a source with various line grounding configurations.

BACKGROUND OF THE INVENTION

AC sensor circuits are often utilized to sense AC voltages associated with control systems and certain power distribution schemes. If the AC sensing circuit includes a common ground that is connected to the earth or to a system ground, and if there is no isolation transformer between the AC source and the AC sensor circuit, then current can flow through the ground path in the sensing circuit. In such a circuit, the sensing circuit's measurement accuracy can be highly dependent on the input AC signal's grounding scheme. For example, different grounding schemes for the input AC signal can include (1) floating AC input; (2) neutral AC input grounded to earth; (3) centered AC input (input taken from a center tapped transformer secondary with a center tap connected to earth ground), or (4) AC input with some finite resistance between neutral and ground. Conventional solutions for sensing the input AC signal often require the use of isolation transformers or step down transformers to float or isolate the AC source from the non-isolated AC sensing circuit. A need exists for a non-isolated AC sensing circuit that can accurately measure an input AC signal regardless of the grounding scheme associated with the AC input.

BRIEF SUMMARY OF THE INVENTION

Some or all of the above needs may be addressed by certain embodiments of the invention. Certain embodiments of the invention may include systems, methods, and apparatus for sensing AC voltage.

According to an example embodiment of the invention, a method is provided for sensing AC voltage. The method includes providing a voltage sensing circuit in communication with an AC power source; rectifying an AC signal from the AC power source with rectifier circuitry of the voltage sensing circuit; applying a first voltage to an analog-to-digital (A-to-D) converter circuit, wherein the first voltage is across a second resistive element of a first half cycle voltage divider comprising a first resistive element and the second resistive element and in communication with a positive DC output of the rectifier circuitry; applying a second voltage to the A-to-D converter circuit, wherein the second voltage is across a fourth resistive element of a second half cycle voltage divider comprising a third resistive element and the fourth resistive element and in communication with a negative DC output of the rectifier circuitry, wherein the first half cycle voltage divider and the second half cycle voltage divider share a common ground; converting the first voltage and the second voltage to a first digital voltage value and second digital voltage value respectively; and analyzing the first digital voltage value and the second digital voltage value by a processor to determine a voltage of the AC power source.

According to another example embodiment, a system is provided for sensing an AC voltage. The system includes rectifier circuitry in communication with an AC power source; a first half cycle voltage divider comprising a first resistive element and a second resistive element and in communication with a positive DC output of the rectifier circuitry; a second half cycle voltage divider comprising a third resistive element and a fourth resistive element and in communication with a negative DC output of the rectifier circuitry; a first capacitive filter in parallel communication with the second resistive element of the first half cycle voltage divider; a second capacitive filter in parallel communication with the fourth resistive element of the second half cycle voltage divider; at least one analog-to-digital (A-to-D) converter circuit in communication with the first half cycle voltage divider and the second half cycle voltage divider; wherein the first half cycle voltage divider and the second half cycle voltage divider share a common ground; and wherein the at least one A-to-D converter circuit is operable to present a first digital voltage value representing a first voltage across the second resistive element of the first half cycle voltage divider and a second digital voltage value representing a second voltage across the fourth resistive element of the second half cycle voltage divider to a processor for analyzing a voltage of the AC power source.

According to another example embodiment, an apparatus is provided for sensing an AC voltage. The apparatus includes rectifier circuitry in communication with an AC power source, wherein the AC power source comprises any one of: (a) an AC power source having a neutral ground to earth; (b) an AC power source having a poor neutral ground to earth; (c) an AC power source with a floating neutral; or (d) an AC power source with a centered AC input; a first voltage divider in communication with a positive DC output of the rectifier circuitry; and a second voltage divider in communication with a negative DC output of the rectifier circuitry, wherein the first and second voltage dividers share a common ground; wherein a voltage of the AC power source is determined based at least in part on a first voltage generated at the first voltage divider and a second voltage generated at the second voltage divider.

Other embodiments, features, and aspects of the invention are described in detail herein and are considered a part of the claimed invention. Other embodiments, features, and aspects can be understood with reference to the following detailed description, accompanying drawings, and claims.

BRIEF DESCRIPTION OF THE FIGURES

Reference will now be made to the accompanying figures and flow diagrams, which are not necessarily drawn to scale, and wherein.

DETAILED DESCRIPTION OF THE INVENTION

Embodiments of the invention will be described more fully hereinafter with reference to the accompanying drawings, in which embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Certain embodiments of the invention may enable AC voltage sensing with a non-isolated sensing circuit. According to certain example embodiments, an accurate measurement of the AC voltage source may be achieved regardless of the AC source grounding scheme. According to example embodiments of the invention, certain circuit components and circuit topologies may enable the non-isolated AC sensing circuit to accurately measure the voltage associated with an AC source under various grounding conditions, including: (a) a neutral ground to earth; (b) a poor neutral ground to earth; (c) a floating neutral; and/or (d) a centered AC input. Example embodiments of the invention will now be described with reference to the accompanying figures.

Figure 1:
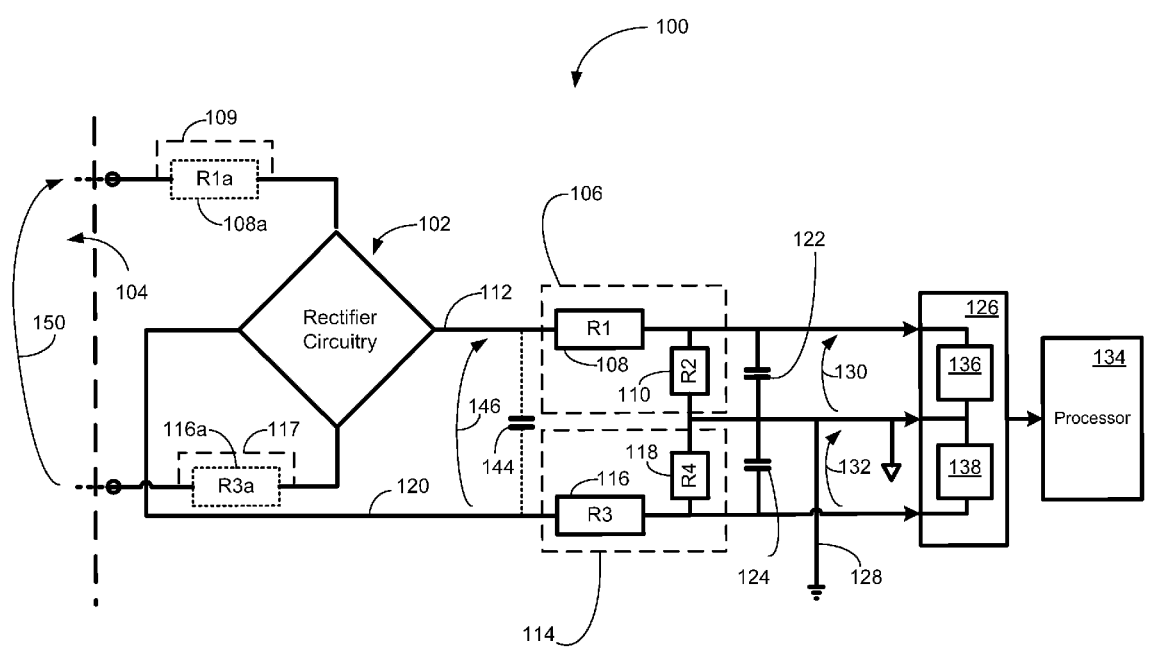
FIG. 1 is a schematic of an illustrative non-isolated AC sensing circuit, according to an example embodiment of the invention.

FIG. 1 illustrates a schematic of a non-isolated AC sensing circuit 100, according to an example embodiment of the invention. In an example embodiment, the circuit 100 may include a rectifier circuitry 102, which may include diodes. For example, the rectifier circuitry 102 may include a bridge rectifier that may receive an AC voltage signal 150 from an AC power source 104. According to an example embodiment, the rectifier circuitry 102 may convert the AC voltage signal 150 to direct current (DC) and provide a positive DC output 112 and a negative DC output 120. According to an example embodiment of the invention, the circuit 100 may include a positive half cycle voltage divider 106 and a negative half voltage divider 114. In an example embodiment, the positive half voltage divider 106 may include a first resistive element (R1) 108 in series with the positive DC output 112, and in communication with a first input of an analog-to-digital converter circuit 126. The positive half voltage divider 106 may also include a second resistive element (R2) 110 connected between the first input of the analog-to-digital converter 126 and a common ground 128. Similarly, the negative half voltage divider 114 may include a third resistive element (R3) 116 in series with the negative DC output 120, and in communication with a second input of an analog-to-digital converter circuit 126. The negative half voltage divider 114 may also include a fourth resistive element (R4) 118 connected between the second input of the analog-to-digital converter 126 circuit and the common ground 128.

According to an example embodiment, a first capacitive filter 122 may be in parallel with the second resistive element (R2) 110 and may reduce AC ripple present on the first voltage 130 (between the common ground 128 and the first input to the analog-to-digital converter circuit 126). According to an example embodiment, a second capacitive filter 124 may be in parallel with the fourth resistive element (R4) 118 and may reduce AC ripple present on the second voltage 132 (between the second input to the analog-to-digital converter circuit 126 and common ground 128. According to an example embodiment, an optional third capacitive filter 144 may be utilized between the positive DC output of rectifier circuitry 112 and the negative DC output of the rectifier circuitry 120 to further filter the AC ripple from the rectifier circuitry 102.

According to an example embodiment, the analog-to-digital converter circuitry 126 may include two or more analog-to-digital converters. For example, a first analog-to-digital converter 136 may receive the first voltage 130, and a second analog-to-digital converter 138 may receive the second voltage 130. In an example embodiment, the first analog-to-digital converter 136 and the second analog-to-digital converter 138 may be connected to the same common ground 128. In an example embodiment, the DC voltage present at the second input of the analog-to-digital converter circuitry 126 may be negative with respect to the common ground 128; therefore, the negative input of the second analog-to-digital converter 138 may be connected to the second input of the analog-to-digital converter circuitry 126, while the positive input of the second analog-to-digital converter 138 may be connected to common ground 128.

According to example embodiments of the invention, the output of the analog-to-digital converter circuitry 126 may be output to a processor 134 for determining the full DC voltage sum (or difference) across the first and second input of the analog-to-digital converter circuitry 126. According to an example embodiment, the first analog-to-digital converter 136 and the second analog-to-digital converter 138 may provide separate outputs for input to the processor 134, and the processor 134 may compute the AC voltage input 150 based on the sum (or difference) of the two separate outputs and the value of the resistors in the voltage divider networks 106, 114.

According to an optional example embodiment of the invention, and as indicated in FIG. 1, the first resistive element (R1) 108 may embody an alternative placement 108a between the AC power source 104 and the rectifier circuitry 102. Otherwise, the optional placement 108a may be connected with a first jumper short 109. In an example embodiment, the third resistive element (R3) 116 may embody a similar optional placement 116a between the AC power source 104 and the rectifier circuitry 102, as indicated in FIG. 1. Otherwise the optional placement 116a may be connected with a second jumper short 117.

In an example embodiment of the invention, the rectifier circuit 102 rectifies the input AC signal 150. The divider resistors (R1, R2, R3, R4) form attenuator or resistor divider which is centered to earth ground 128. The number and value of divider resistors depend on the value of voltage handling capability across the first filtering capacitor 122 and the second filtering capacitor 124. The third filtering capacitor 144 is optional and may provide a trade-off between the accuracy required and cost, as it may be a high voltage rated capacitor.

Figure 2:
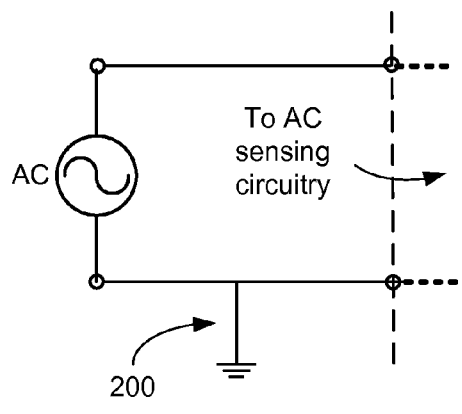
FIG. 2 is a schematic diagram of an illustrative neutral-grounded AC source, according to an example embodiment of the invention.
Figure 3:
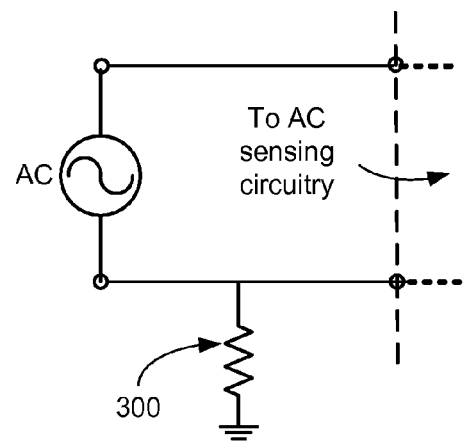
FIG. 3 is a schematic diagram of an illustrative partially grounded AC source, according to an example embodiment of the invention.
Figure 4:
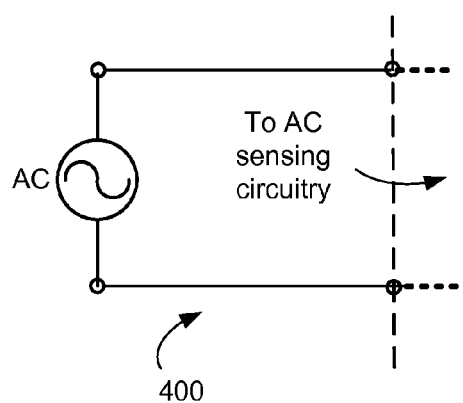
FIG. 4 is a schematic diagram of an illustrative floating AC source, according to an example embodiment of the invention.
Figure 5:
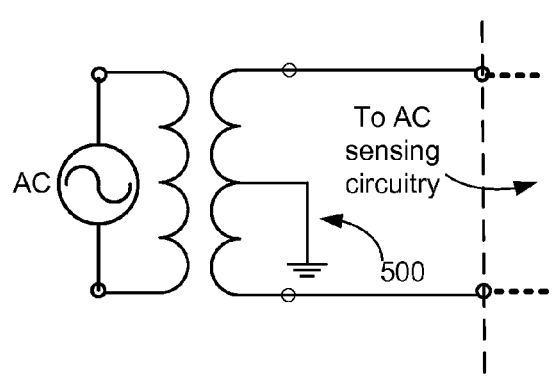
FIG. 5 is a schematic diagram of an illustrative center grounded AC source, according to an example embodiment of the invention.

FIGS. 2-5 indicate the various AC power source embodiments and grounding configurations for which the AC voltage may be measured by the AC voltage sensing circuit 100 of FIG. 1. For example, FIG. 2 depicts an AC power source having a neutral ground to earth 200. FIG. 3 depicts an AC power source having a poor neutral ground to earth, or a finite resistance connecting neutral to earth ground. FIG. 4 depicts an AC power source with a floating neutral. And FIG. 5 depicts an AC power source with a center tap grounded AC transformer input According to example embodiments, each of these grounding configurations may be utilized and measured with the AC voltage sensing circuit 100 of FIG. 1.

In an example embodiment, the earthed neutral AC input (as shown in FIG. 2) may provide a positive and negative half cycle for the sensing system. For a positive half cycle, the current flows through the rectifier circuitry 102, the first resistor (R1) 108, the second resistor (R2) 110 and to earth ground 128. For negative half cycle, the current flows through earth ground 128, the fourth resistor (R4) 118, the third resistor (R3) 116, and through the other branch of the rectifier circuitry 102. For both the half cycles, the associated divider circuit (106 or 114) divides the corresponding half cycle voltage and not the full voltage. In an example embodiment, the resulting first voltage 130 and second voltage 132 may be converted to digital signals via analog-to-digital converter circuitry 125, or optionally, via voltage controlled oscillators. A processor 134 may calculate difference (or sum depending on the polarity configuration of the analog-to-digital converter circuitry 125 or voltage controlled oscillators). The processor 134 may extrapolate the result to determine the input AC voltage 150 based on the value of resistor divider network.

A similar operation may take place in poor earth neutral connection AC source (as shown in FIG. 3, but for this configuration, during the positive half cycle the poor contact/ cable resistance 300 is in series with positive half voltage divider 106 and the ground but in parallel with the negative half voltage divider 114. So during the positive half cycle, the current flows through rectifier diode, (R1) 108, (R2) 110 and ground. From ground it returns back to neutral through two paths. One is through the leakage resistor 300 and the second is through (R4) 118, (R3) 116 and the other diode of rectifier 102. The voltage drop across (R4) 118 is proportional to the voltage drop across the poor ground contact resistance 300. During the negative half cycle the poor contact/cable resistance 300 is in series with negative half voltage divider 114 and the ground but in parallel with the positive half voltage divider 106. So during the negative half cycle, the current flows through the leakage resistor 300 to ground and through rectifier diode 102, (R1) 106, (R2) 110 to ground. From ground, the current flows back to phase through (R3) 116, (R4) 118 and through other diode of rectifier 102. The voltage drop across (R2) 110 corresponds to the voltage drop across the poor ground contact resistance 300. The voltage drop across (R4) 118 during positive half cycle and voltage drop across (R2) 110 during negative half cycle compensate the error due to 300 to a great extent. According to an example embodiment, a processor 134 may calculate difference (or sum depending on the polarity configuration of the analog-to-digital converter circuitry 125 or voltage controlled oscillators). The processor 134 may extrapolate the result to determine the input AC voltage 150 based on the value of resistor divider network.

In example embodiments with a floating neutral AC source (as shown in FIG. 4), for both the rectified half cycles, current flows through the rectifier circuitry 102, the first resistive element (R1) 108, the second resistive element (R2) 110, the fourth resistive element (R4) 118, the third resistive element (R3) and back through the rectifier circuitry 102. According to an example embodiment, a processor 134 may calculate difference (or sum depending on the polarity configuration of the analog-to-digital converter circuitry 125 or voltage-controlled oscillators). The processor 134 may extrapolate the result to determine the input AC voltage 150 based on the value of resistor divider network.

Figure 6:
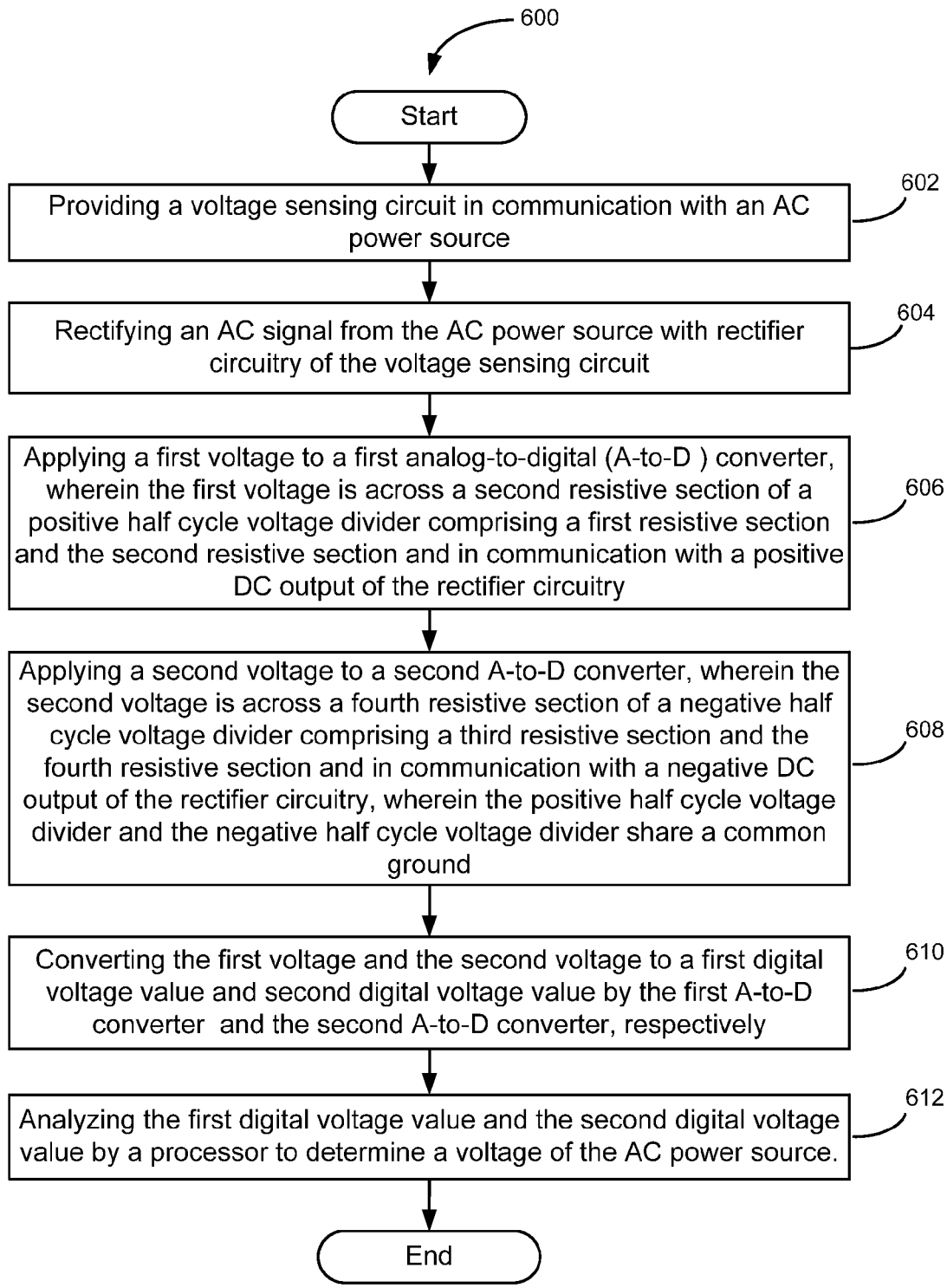
FIG. 6 is a flow diagram of a method, according to an example embodiment of the invention.

In example embodiments with a centered AC source (as shown in FIG. 5), for both the rectified half cycles, current flows through the rectifier circuitry 102, the first resistive element (R1) 108, the second resistive element (R2) 110, the fourth resistive element (R4) 118, the third resistive element (R3) and back through the rectifier circuitry 102. A processor 134 may calculate difference (or sum depending on the polarity configuration of the analog-to-digital converter circuitry 125 or voltage-controlled oscillators). The processor 134 may extrapolate the result to determine the input AC voltage 150 based on the value of resistor divider network. An example method 300 for sensing AC voltage will now be described with reference to the flowchart of FIG. 6. The method 600 starts in block 602 and includes providing a voltage sensing circuit in communication with an AC power source. In block 604, the method 600 includes rectifying an AC signal from the AC power source with rectifier circuitry of the voltage sensing circuit. In block 606, the method 600 includes applying a first voltage to an analog-to-digital (A-to-D) converter circuit, wherein the first voltage is across a second resistive element of a first half cycle voltage divider comprising a first resistive element and the second resistive element and in communication with a positive DC output of the rectifier circuitry. In block 608, the method 600 includes applying a second voltage to the A-to-D converter circuit, wherein the second voltage is across a fourth resistive element of a second half cycle voltage divider comprising a third resistive element and the fourth resistive element and in communication with a negative DC output of the rectifier circuitry, wherein the first half cycle voltage divider and the second half cycle voltage divider share a common ground. In block 610, the method 600 includes converting the first voltage and the second voltage to a first digital voltage value and second digital voltage value respectively. In block 612, the method 600 includes analyzing the first digital voltage value and the second digital voltage value by a processor to determine a voltage of the AC power source. The method 600 ends after block 612.

Example embodiments further include filtering the first voltage 130 with a first capacitive filter 122 in parallel communication with the second resistive element 110 of the first half cycle voltage divider 106 and filtering the second voltage 132 with a second capacitive filter 124 in parallel communication with the fourth resistive 118 element of the second half cycle voltage divider 114. In example embodiments, analyzing the first digital voltage value and the second digital voltage value by the processor 134 includes determining the voltage of the AC power source 150 based at least in part on the first digital voltage value, the second digital voltage value, and resistances of the first resistive element 108, the second resistive element 110, the third resistive element 116, and the fourth resistive element 118.

According to example embodiments, the AC power source 104 includes any one of: (a) an AC power source having a neutral ground to earth 200; (b) an AC power source having a poor neutral ground to earth 300; (c) an AC power source with a floating neutral 400; or (d) an AC power source with a centered tap grounded AC transformer input 500. In example embodiments, the AC power source 104 includes an AC power source having a neutral ground to earth 200, and wherein determining the voltage of the AC power source 150 is based at least in part on the difference between the first voltage value 130 and the second voltage value 132.

In an example embodiment, converting the first voltage 130 and the second voltage 132 include converting the first voltage 130) to a first digital voltage value and converting the second voltage 132 to a second digital voltage value by the A-to-D converter circuit 126, wherein the A-to-D converter circuit 126 comprises at least one A-to-D converter and a multiplexer or a first A-to-D converter 136 and a second A-to-D converter 138.

According to an example embodiment, the AC power source 104 includes an AC power source having a floating neutral 400, and analyzing the first digital voltage value and the second digital voltage value by the processor 134 includes determining the voltage of the AC power source 150 based at least in part on a difference between the first voltage value 130 and the second voltage value 132.

In accordance with example embodiments of the invention, a system 100 or apparatus is provided for sensing an AC voltage. The system can include rectifier circuitry 102 in communication with an AC power source 104; a first half cycle voltage divider 106 which may include a first resistive element 108 and a second resistive element 110 and in communication with a positive DC output 112 of the rectifier circuitry 102; a second half cycle voltage divider 114 which may include a third resistive element 116 and a fourth resistive element 118 and in communication with a negative DC output 120 of the rectifier circuitry 102; a first capacitive filter 122 in parallel communication with the second resistive element 110 of the first half cycle voltage divider 106; a second capacitive filter 124 in parallel communication with the fourth resistive element 118 of the second half cycle voltage divider 114; at least one analog-to-digital (A-to D) converter circuit 126 in communication with the first half cycle voltage divider 106 and the second half cycle voltage divider 114; wherein the first half cycle voltage divider 106 and the second half cycle voltage divider 114 share a common ground 128; and wherein the at least one A-to-D converter circuit 126 is operable to present a first digital voltage value representing a first voltage 130 across the second resistive element 110 of the first half cycle voltage divider 106 and a second digital voltage value representing a second voltage 132 across the fourth resistive element 118 of the second half cycle voltage divider 114 to a processor 134 for analyzing a voltage of the AC power source 150.

In an example embodiment, the processor 134 analyzes the voltage of the AC power source 150 based at least in part on the first voltage 130, the second voltage 132, and resistances of the first resistive element 108, the second resistive element 110, the third resistive element 116, and the fourth resistive element 118. According to an example embodiment, the system 100 is operable to detect the voltage of the AC power source 150, wherein the AC power source 104 includes any one of: (a) an AC power source having a neutral ground to earth 200; (b) an AC power source having a poor neutral ground to earth 300; (c) an AC power source with a floating neutral 400; or (d) an AC power source with a center tap grounded AC transformer input 500.

In an example embodiment, the AC power source 104 includes a neutral ground to earth 200, and analyzing the voltage of the AC power source 150 is based at least in part on the difference between the first voltage 130 and the second voltage 132. In an example embodiment, the at least one A-to-D converter circuit 126 includes at least one A-to-D converter and a multiplexer or a first A-to-D converter 136 and a second A-to-D converter 138. In an example embodiment, the AC power source 104 includes a floating neutral 400, and analyzing the voltage of the AC power source 150 is based at least in part on a difference between the first voltage 130 and the second voltage 132.

In an example embodiment, the rectifier circuitry 102 includes at least one diode. The rectifier circuitry 102 can include a diode bridge rectifier. According to an example embodiment, the at least one A-to-D converter 136 can include a first A-to-D converter 136 and a second A-to-D converter 138, where the first A-to-D converter 136 is in communication across the second resistive element 110 of the first half cycle voltage divider 106, and where the second A-to-D converter 138 is in communication across the fourth resistive element 118 of the second half cycle voltage divider 114. In an example embodiment, at least one of the optional placement first resistive element 108a or the optional placement third resistive element 116a is in series communication between the AC power source 104 and the rectifier circuitry 102. In an example embodiment, at least one of the first resistive element 108 of the first half cycle voltage divider 106 or the third resistive element 116 of the second half cycle voltage divider 114 includes a plurality of resistive elements. In an example embodiment, the system 100 can further include a third capacitive filter 144 in parallel communication across a DC output 146 of the rectifier circuitry.

Accordingly, example embodiments of the invention can provide the technical effects of creating certain systems, methods, and apparatus that provide non-isolated AC voltage measurement. Example embodiments of the invention can provide the further technical effects of providing systems, methods, and apparatus for providing non-isolated AC voltage measurements for AC sources with various grounding schemes, including floating, partially grounded neutral, grounded neutral, and centered ground.

In example embodiments of the invention, the system 100 for sensing AC voltage may include any number of hardware and/or software applications that are executed to facilitate any of the operations.

In example embodiments, one or more I/O interfaces may facilitate communication between the system 100 for sensing AC voltage and one or more input/output devices. For example, a universal serial bus port, a serial port, a disk drive, a CD-ROM drive, and/or one or more user interface devices, such as a display, keyboard, keypad, mouse, control panel, touch screen display, microphone, etc., may facilitate user interaction with the system 100 for sensing AC voltage. The one or more I/O interfaces may be utilized to receive or collect data and/or user instructions from a wide variety of input devices. Received data may be processed by one or more computer processors as desired in various embodiments of the invention and/or stored in one or more memory devices.

One or more network interfaces may facilitate connection of the system 100 for sensing AC voltage inputs and outputs to one or more suitable networks and/or connections; for example, the connections that facilitate communication with any number of sensors associated with the system. The one or more network interfaces may further facilitate connection to one or more suitable networks; for example, a local area network, a wide area network, the Internet, a cellular network, a radio frequency network, a Bluetooth™ (owned by Telefonaktiebolaget LM Ericsson) enabled network, a Wi-Fi™ (owned by Wi-Fi Alliance) enabled network, a satellite-based network any wired network, any wireless network, etc., for communication with external devices and/or systems.

As desired, embodiments of the invention may include the system 100 for sensing AC voltage with more or less of the components illustrated in FIG. 1.

The invention is described above with reference to block and flow diagrams of systems, methods, apparatuses, and/or computer program products according to example embodiments of the invention. It will be understood that one or more blocks of the block diagrams and flow diagrams, and combinations of blocks in the block diagrams and flow diagrams, respectively, can be implemented by computer-executable program instructions. Likewise, some blocks of the block diagrams and flow diagrams may not necessarily need to be performed in the order presented, or may not necessarily need to be performed at all, according to some embodiments of the invention.

These computer-executable program instructions may be loaded onto a general-purpose computer, a special-purpose computer, a processor, or other programmable data processing apparatus to produce a particular machine, such that the instructions that execute on the computer, processor, or other programmable data processing apparatus create means for implementing one or more functions specified in the flow diagram block or blocks. These computer program instructions may also be stored in a computer-readable memory that can direct a computer or other programmable data processing apparatus to function in a particular manner, such that the instructions stored in the computer-readable memory produce an article of manufacture including instruction means that implement one or more functions specified in the flow diagram block or blocks. As an example, embodiments of the invention may provide for a computer program product, comprising a computer-usable medium having a computer-readable program code or program instructions embodied therein, said computer-readable program code adapted to be executed to implement one or more functions specified in the flow diagram block or blocks. The computer program instructions may also be loaded onto a computer or other programmable data processing apparatus to cause a series of operational elements or steps to be performed on the computer or other programmable apparatus to produce a computer-implemented process such that the instructions that execute on the computer or other programmable apparatus provide elements or steps for implementing the functions specified in the flow diagram block or blocks.

Accordingly, blocks of the block diagrams and flow diagrams support combinations of means for performing the specified functions, combinations of elements or steps for performing the specified functions and program instruction means for performing the specified functions. It will also be understood that each block of the block diagrams and flow diagrams, and combinations of blocks in the block diagrams and flow diagrams, can be implemented by special-purpose, hardware-based computer systems that perform the specified functions, elements or steps, or combinations of special-purpose hardware and computer instructions.

While the invention has been described in connection with what is presently considered to be the most practical and various embodiments, it is to be understood that the invention is not to be limited to the disclosed embodiments, but on the contrary, is intended to cover various modifications and equivalent arrangements included within the scope of the appended claims. Although specific terms are employed herein, they are used in a generic and descriptive sense only and not for purposes of limitation.

This written description uses examples to disclose the invention, including the best mode, and also to enable any person skilled in the art to practice the invention, including making and using any devices or systems and performing any incorporated methods. The patentable scope of the invention is defined in the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A method for sensing AC voltage, comprising:
providing a voltage sensing circuit in communication with an AC power source;
rectifying an AC signal from the AC power source with rectifier circuitry of the voltage sensing circuit;
applying a first voltage to an analog-to-digital (A-to-D) converter circuit, wherein the first voltage is across a second resistive element of a first half cycle voltage divider comprising a first resistive element and the second resistive element and in communication with a positive DC output of the rectifier circuitry;
applying a second voltage to the A-to-D converter circuit, wherein the second voltage is across a fourth resistive element of a second half cycle voltage divider comprising a third resistive element and the fourth resistive element and in communication with a negative DC output of the rectifier circuitry, wherein the first half cycle voltage divider and the second half cycle voltage divider share a common ground;
converting the first voltage and the second voltage to a first digital voltage value and second digital voltage value respectively; and
analyzing the first digital voltage value and the second digital voltage value by a processor to determine a voltage of the AC power source.

2. The method of claim 1, further comprising filtering the first voltage with a first capacitive filter in parallel communication with the second resistive element of the first half cycle voltage divider and filtering the second voltage with a second capacitive filter in parallel communication with the fourth resistive element of the second half cycle voltage divider.

3. The method of claim 1, wherein analyzing the first digital voltage value and the second digital voltage value by the processor comprises determining the voltage of the AC power source based at least in part on the first digital voltage value, the second digital voltage value, and resistances of the first resistive element, the second resistive element, the third resistive element, and the fourth resistive element.

4. The method of claim 1, wherein the AC power source comprises any one of: (a) an AC power source having a neutral ground to earth; (b) an AC power source having a poor neutral ground to earth; (c) an AC power source with a floating neutral; or (d) an AC power source with a centered tap grounded AC transformer input.

5. The method of claim 1, wherein the AC power source comprises an AC power source having a neutral ground to earth, and wherein determining the voltage of the AC power source is based at least in part on the difference between the first voltage value and the second voltage value.

6. The method of claim 1, wherein converting the first voltage and the second voltage comprises converting the first voltage to a first digital voltage value and converting the second voltage to a second digital voltage value by the A-to-D converter circuit, wherein the A-to-D converter circuit comprises at least one A-to-D converter or voltage controlled oscillator and a multiplexer or a first A-to-D converter or first voltage controlled oscillator and a second A-to-D converter or second voltage controlled oscillator.

7. The method of claim 1, wherein the AC power source comprises an AC power source having a floating neutral, and wherein analyzing the first digital voltage value and the second digital voltage value by the processor comprises determining the voltage of the AC power source based at least in part on a difference between the first voltage value and the second voltage value.

8. A system for sensing an AC voltage, comprising:
rectifier circuitry in communication with an AC power source;
a first half cycle voltage divider comprising a first resistive element and a second resistive element and in communication with a positive DC output of the rectifier circuitry;
a second half cycle voltage divider comprising a third resistive element and a fourth resistive element and in communication with a negative DC output of the rectifier circuitry;
a first capacitive filter in parallel communication with the second resistive element of the first half cycle voltage divider;
a second capacitive filter in parallel communication with the fourth resistive element of the second half cycle voltage divider;

at least one analog-to-digital (A-to D) converter circuit in communication with the first half cycle voltage divider and the second half cycle voltage divider;

wherein the first half cycle voltage divider and the second half cycle voltage divider share a common ground; and wherein the at least one A-to-D converter circuit is operable to present a first digital voltage value representing a first voltage across the second resistive element of the first half cycle voltage divider and a second digital voltage value representing a second voltage across the fourth resistive element of the second half cycle voltage divider to a processor for analyzing a voltage of the AC power source.

9. The system of claim 8, wherein the processor analyzes the voltage of the AC power source based at least in part on the first voltage, the second voltage, and resistances of the first resistive element, the second resistive element, the third resistive element, and the fourth resistive element.

10. The system of claim 8, wherein the system is operable to detect the voltage of the AC power source, wherein the AC power source comprises any one of: (a) an AC power source having a neutral ground to earth; (b) an AC power source having a poor neutral ground to earth; (c) an AC power source with a floating neutral; or (d) an AC power source with a center tap grounded AC transformer input.

11. The system of claim 8, wherein the AC power source comprises an AC power source having a neutral ground to earth, and wherein analyzing the voltage of the AC power source is based at least in part on the difference between the first voltage and the second voltage.

12. The system of claim 8, wherein the at least one A-to-D converter circuit comprises at least one A-to-D converter or voltage controlled oscillator and a multiplexer or a first A-to-D converter or first voltage controlled oscillator and a second A-to-D converter or second voltage controlled oscillator.

13. The system of claim 8, wherein the AC power source comprises an AC power source having a floating neutral, and wherein analyzing the voltage of the AC power source is based at least in part on a difference between the first voltage and the second voltage.

14. The system of claim 8, wherein the rectifier circuitry is in communication with at least one filtering capacitor.

15. The system of claim 8, wherein the rectifier circuitry comprises a diode bridge rectifier.

16. The system of claim 8, wherein the at least one A-to-D converter comprises a first A-to-D converter and a second A-to-D converter, wherein the first A-to-D converter is in communication across the second resistive element of the first half cycle voltage divider, and wherein the second A-to-D converter is in communication across the fourth resistive element of the second half cycle voltage divider.

17. The system of claim 8, wherein at least one of the first resistive element (108a) or the third resistive element (116a) is in series communication between the AC power source and the rectifier circuitry.

18. The system of claim 8, wherein at least one of the first resistive element of the first half cycle voltage divider or the third resistive element of the second half cycle voltage divider comprises a plurality of resistive elements.

19. The system of claim 8, further comprising a third capacitive filter in parallel communication across a DC output of the rectifier circuitry.

20. An apparatus for sensing an AC voltage, comprising:
rectifier circuitry in communication with an AC power source, wherein the AC power source comprises any one of: (a) an AC power source having a neutral ground to earth; (b) an AC power source having a poor neutral ground to earth; (c) an AC power source with a floating neutral; or (d) an AC power source with a centered AC input;

a first voltage divider in communication with a positive DC output of the rectifier circuitry; and a second voltage divider in communication with a negative DC output of the rectifier circuitry, wherein the first and second voltage dividers share a common ground;

wherein a voltage of the AC power source is determined based at least in part on a first voltage generated at the first voltage divider and a second voltage generated at the second voltage divider.

* * * * *